United States Patent [19]

Rinefierd, Jr.

[11] Patent Number: 4,542,443
[45] Date of Patent: Sep. 17, 1985

[54] TERMINATION FRAME ASSEMBLY WITH PROTECTION FROM EMI FROM FIELD WIRING AND RACK FOR SAME

[75] Inventor: Robert J. Rinefierd, Jr., Irwin, Pa.

[73] Assignee: Westinghouse Electric Corp., Pittsburgh, Pa.

[21] Appl. No.: 520,977

[22] Filed: Aug. 8, 1983

[51] Int. Cl.[4] ............................................. H05K 7/14
[52] U.S. Cl. ................................. 361/415; 361/399; 361/393
[58] Field of Search ............................. 361/390–395, 361/399, 413, 415, 424; 339/17 LM, 17 M; 174/50–50.54, 35 R, 35 TS, 36

[56] References Cited

U.S. PATENT DOCUMENTS 3,766,550 10/1973 Vandemore et al. ............... 361/415
4,442,476 4/1984 Lenderking et al. ............... 361/395

Primary Examiner—A. T. Grimley
Assistant Examiner—T. M. Basma
Attorney, Agent, or Firm—Daniel C. Abeles

[57] ABSTRACT

A termination frame assembly mounts signal conditioner circuit boards for a data acquisition system individually on a frame with an electromagnetic interference (EMI) barrier extending along the front edge and bending back over the circuit board and then out to form an integral trough through which the field wiring is routed to field terminals on terminal strips in the front face of the barrier. The circuit board is installed from the rear with a guide block, keyed to accept only a selected one of a family of boards, lifting the center of the leading edge to align edge connectors with connectors on the rear of the terminal strips. A plurality of the termination frame assemblies are stacked between, and secured to the front and rear legs of, confronting U-shaped channel members with the field wiring routed vertically along the front legs to the horizontal troughs and with power supply and test signal busses routed along one rear leg and connected by leads to plugs on the termination frame assemblies which engage terminations on the leading edge of the circuit board as it is installed. Additional leads on these plugs are connected to complete a series circuit only when all circuit boards are installed. The stacked termination frame assemblies are mounted in a cabinet with the field terminals and the field wiring in the recessed troughs accessible through a rear door and with the circuit boards which are connected to other equipment in the cabinet by connectors on their trailing edges accessible through the front door.

23 Claims, 10 Drawing Figures

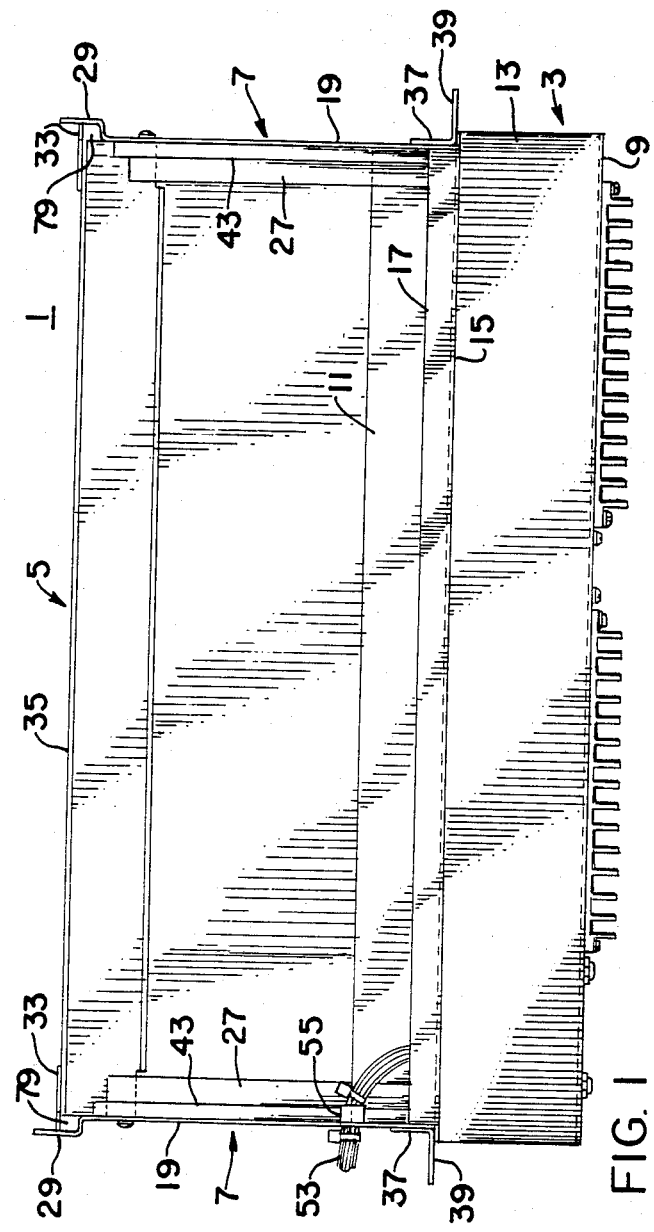
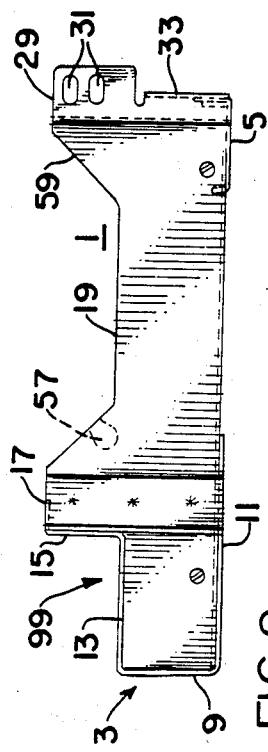
FIG. 1
FIG. 2

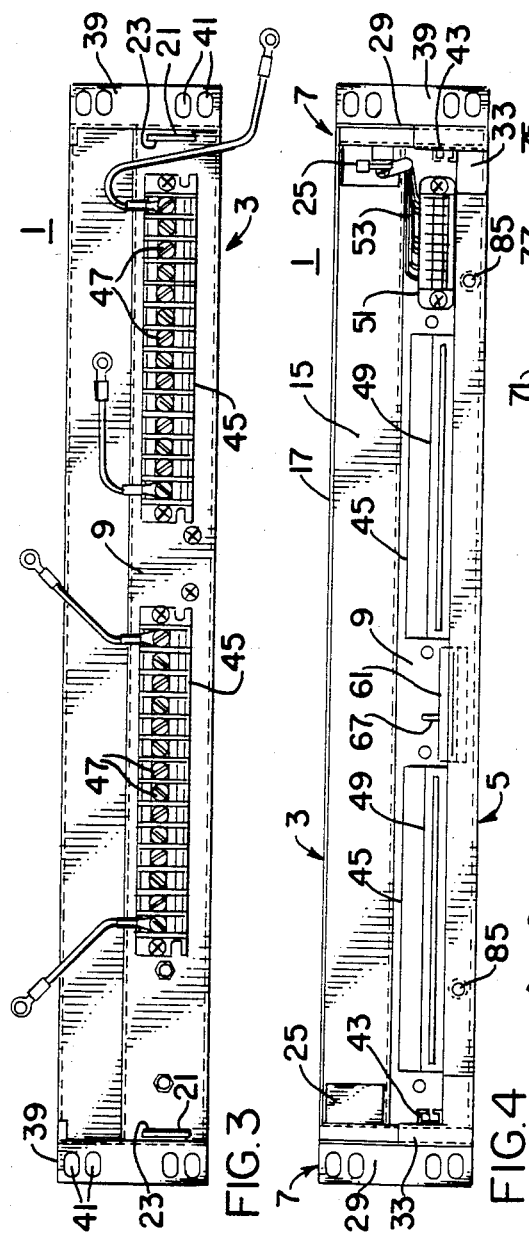
FIG.3
FIG.4
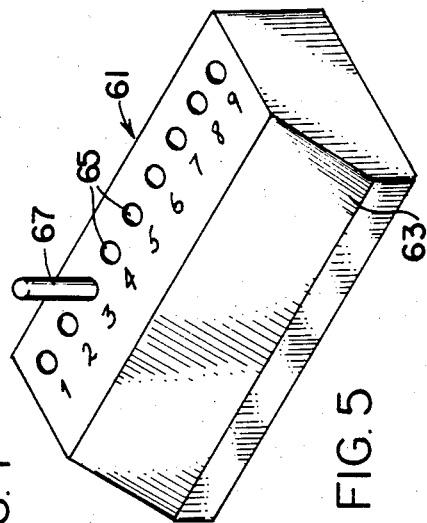
FIG.5
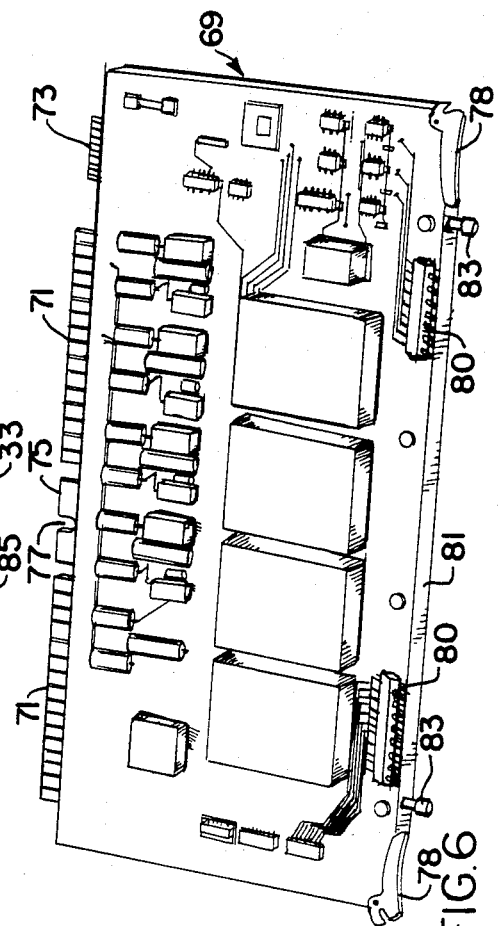
FIG.6

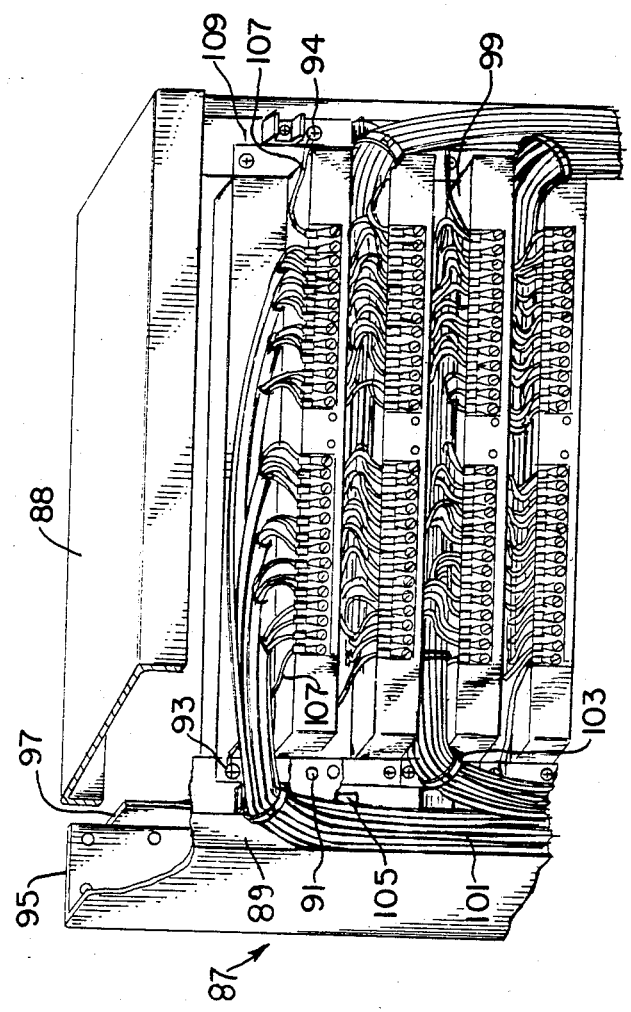

TERMINATION FRAME ASSEMBLY WITH PROTECTION FROM EMI FROM FIELD WIRING AND RACK FOR SAME

BACKGROUND OF THE INVENTION

1. Field of the Invention

This invention is directed to a seismically qualified termination frame assembly for mounting electronic circuit boards such as signal conditioner circuit boards for data acquisition systems and for providing protection of the circuit board input and/or output signals from surges and from electromagnetic interference (EMI) generated by noise on the field wiring to which the input and output circuits on the boards are connected. The invention further encompasses apparatus which mounts a plurality of such assemblies with all of the field wiring accessible from one side of an EMI barrier and the circuit boards accessible from the other side, and which incorporates busses for supplying power, test signals and a common ground to the boards through plug-in connections.

2. Prior Art

Present day electronic data acquisition systems commonly use microprocessors mounted on printed circuit boards to manage data input and output. The industrial grade printed wiring boards typically used are extremely sensitive to noise, and to electromagnetic, including radio frequency, interference. In addition, the various field signals are often referenced to a high common mode voltage and are susceptible to line surges. In order to combat these difficulties, a family of front-end printed circuit signal conditioner boards is used to provide the required system immunity.

Another problem encountered in such data acquisition systems is that the field wiring, such as for instance, neoprene jacketed AWG #16 shielded pair cabling which measures ⅜ inch in diameter, is not compatible in size with the edge connectors used to interface with the densely packed terminations on the computer input/output boards. This requires intermediate wiring between the field wiring and the card edge connectors.

In the typical data acquisition system, the field wiring is terminated on a barrier strip in a cabinet housing the microprocessor. The signal conditioning circuitry is located either in the computer chassis or in a separate card cage mounted nearby. This packaging approach allows electrical noise coming into the cabinet on the field wiring to exist inside the cabinet in close proximity to the sensitive unprotected electronics and thereby defeats the use of the protective signal conditioning circuits.

SUMMARY OF THE INVENTION

In accordance with the present invention, an electrically conductive barrier is provided between the field wiring and the protective signal conditioner boards. The barrier is incorporated into individual enclosures, referred to as termination frame assemblies, provided for each signal conditioner boards. Each termination frame assembly comprises a substantially rectangular frame member with the electrically conductive barrier member extending across the width of the frame generally perpendicular to one face and with at least a portion spaced from the front edge of the frame member. The circuit board is mounted on the frame member on one side of the barrier member between the barrier member and the rear edge of the frame member. The field wiring is connected on the other side of the barrier member to terminals on terminal strips which extend through the barrier and have connectors which make electrical connections on the first side of the barrier member with the circuits on the electronic circuit board. The barrier member extends perpendicular to the frame member a sufficient distance, and the one portion is spaced a sufficient distance from the front edge of the frame member, to form a recess separated from the circuit board by the barrier in which the field wiring for the circuit board can be routed from one side of the termination frame assembly across the assembly to the terminal strips, substantially without extending beyond the front edge of the assembly or the free edge of the barrier member.

In the preferred embodiment of the invention, the barrier member has a first portion which extends substantially perpendicular to the front edge of the frame member, a second portion which extends from the free end of the first portion toward the rear of the frame and a third portion which extends perpendicular to the plane of the rectangular frame member from the rear edge of the second portion with the terminal strip mounted in the first portion and with the second and third portions forming the recess through which the field wiring is routed. This makes a very compact arrangement in which the barrier bends back over the circuit board and then outward so that the field wiring lies above the leading edge of the board but is separated from it by the barrier member.

The circuit board is installed in the frame member from the rear by inserting the side edges in slotted members running along the sides of the frame. As the board is installed, the terminations on the leading edge of the board engage the connectors on the field wiring terminal strips. In addition, insertion of the board also makes electrical contact with a plug and additional wiring, protected from the field wiring by the barrier, which connects the board with other electrical circuits such as power supplies and test signals. With this arrangement, the boards can be easily installed and replaced without disturbing the field wiring or the power supply and test circuits. Additional connectors on the trailing edge of the circuit board connect the board's circuits through additional cabling to the microprocessor boards.

Guide means mounted on the termination frame assembly lift up the leading edge of the circuit board to align the terminations with the terminal strip connectors and the power supply plug as the board is installed. Keying means, preferably in the form of a pin positioned in one of a series of holes in the guide member aligned with a notch in the leading edge of an appropriate circuit board, prevents installation of an incorrect member of the circuit board family in a particular termination frame assembly.

Any number of the termination frames may be stacked vertically and secured between two horizontally spaced vertical supports. The recess formed by the second and third portions of the barrier member on each frame forms with the underside of the assembly above a trough open only to the front through which the field wiring is routed. By securing the termination frame assemblies to the vertical supports with the rear of the recess essentially aligned with the front faces of the vertical supports, the field wiring can be routed along the front of the supports and through the troughs in a common vertical plane. In this configuration, electrically conductive side and bottom walls on the frame assemblies fill the gaps at the end of the barrier member and under the leading edges of the circuit boards to completely isolate the boards from the field wiring.

The power supply and test signal leads from the plug of each termination frame assembly are connected adjacent the assembly to busses also running along the vertical supports but separated from the front face which carries the field wiring by electrically conductive material. Preferably, the vertical supports are confronting U-shaped electrically conductive channel members with the field wiring running along the outer surface of the front leg and the busses running along the outer surface of the rear leg for easy access from the front and rear respectively. Leads from terminals on the bus bars adjacent each termination frame assembly are routed through holes in the rear leg of the channel member to the power plug. Additional leads connected between the plugs on selected assemblies complete a series circuit only when this circuit boards on all of the selected assemblies are in place to provide the microcomputer with an indication of whether a missing signal is due to a failed circuit or a missing board.

The termination frame assemblies are secured to both the front and rear legs of the U-shaped channel members for rigid support. The circuit boards are firmly gripped on the side edges by the slotted guide members, on the front edge by the connectors and power plug and the rear edge is provided with a flange which is removably secured to the rear edge of the frame member so that the whole assembly meets the standards for seismic qualifications.

A common ground is created for the apparatus by the connection of the electrically conductive termination frame assemblies to the channel members. In addition, ground leads from the terminal strips are terminated on the channel members separate screw to provide the ground for the circuit boards. A ground bus bar secured by the same fasteners that connect the termination frame assemblies and ground wires to the channel members provides a low impedance path to the system ground.

The stacked termination frame assemblies are mounted in a cabinet with their front faces on which the terminal strips are mounted facing the rear door of the cabinet so that the field wiring and the terminals to which they are connected are accessible through the rear door. Between the rear of the termination frame assemblies and the cabinet front door, a card cage containing signal processing circuit boards is mounted, with cabling connecting plug-in terminations on the trailing edge of the signal conditioning boards with the signal processing boards. With this arrangement, the signal processing boards which utilize the conditioned signals from the signal conditioning boards are protected from EMI from the field wiring by the barrier members on the termination frame assemblies and the electrically conductive channels which support them. The card cage is removable from the space between the back of the frame assemblies and the cabinet front door to provide convenient access for sliding the signal conditioning circuit boards in and out of the termination frame assemblies and for reaching the busses and associated terminals extending along the rear legs of the supporting channel members.

BRIEF DESCRIPTION OF THE DRAWINGS

FIG. 1 is a plan view of a termination frame assembly according to the invention;

FIG. 2 is a side elevation view of the termination frame assembly of FIG. 1;

FIG. 3 is a front elevation view of the termination frame assembly of FIG. 1;

FIG. 4 is a rear elevation view of the termination frame assembly of FIG. 1;

FIG. 5 is an isometric view of a guide block which is a part of the termination frame assembly of FIGS. 1 through 4;

FIG. 6 is an isometric view of a printed circuit board which is mounted in the termination frame assembly of FIGS. 1 through 4;

FIG. 10 is an isometric view of the stacked termination frame assemblies illustrating the routing of the field wiring in accordance with the teachings of the invention.

DESCRIPTION OF THE PREFERRED EMBODIMENT

Figure 7:
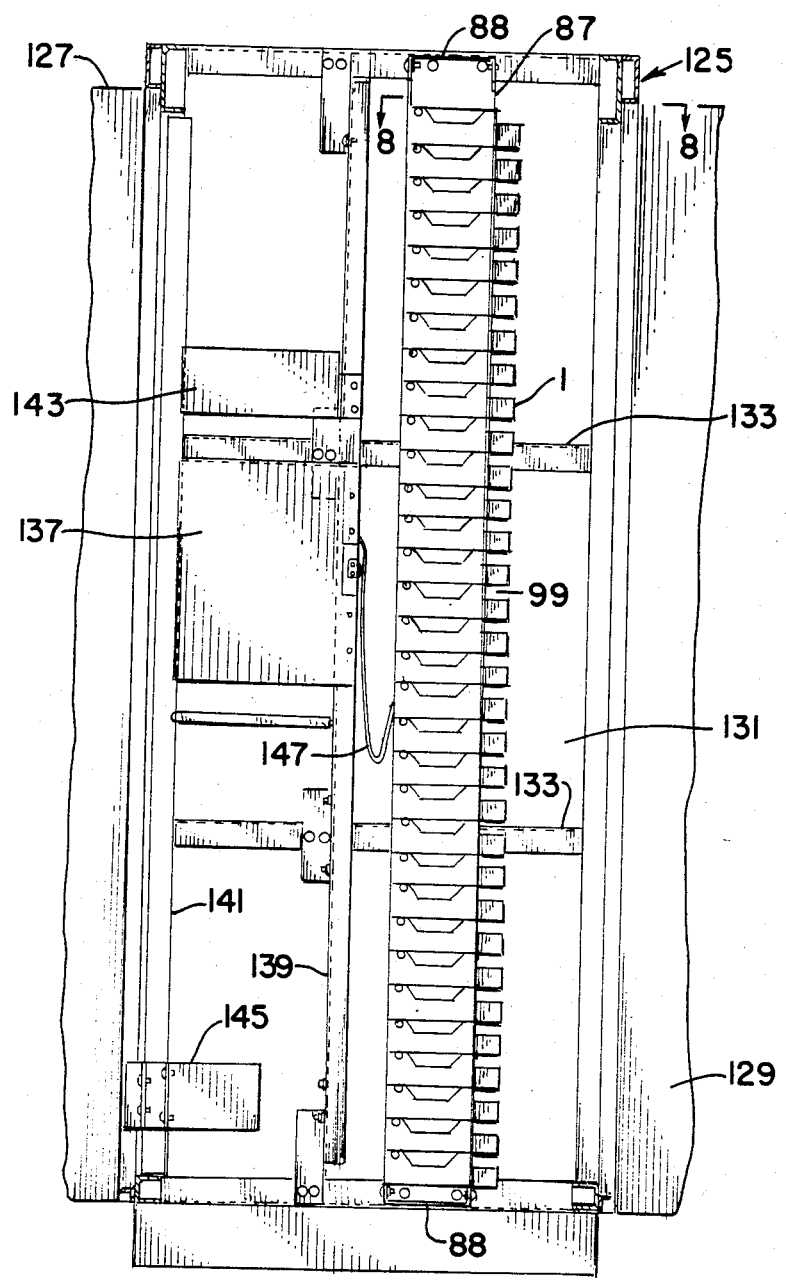
FIG. 7 is a longitudinal vertical section through an instrumentation cabinet illustrating the stacking of termination frame assemblies of FIGS. 1 through 4 in accordance with the teachings of the invention.

The termination frame assemblies 1 of the invention include front and rear brackets 3 and 5 respectively, and side brackets 7 which together form the rectangular frame and barrier member as best seen in FIGS. 1 through 4. All of the brackets are fabricated from electrically conductive sheet material with steel being preferred because of its strength as well as its capacity to provide shielding from electromagnetic interference.

The front bracket 3 of the termination frame assembly 1 is a piece of sheet steel bent into a horizontally oriented U shape with a base 9 and lower and upper legs 11 and 13 respectively. The upper leg 13 terminates in a vertical section 15 followed by a horizontal flange 17. Each of the side brackets 7 from vertical side walls 19 which at their forward ends fit within the horizontal opening of the front bracket 3. A projection 21 on the forward edge of the side wall 19 seats in a slot 23 in the base 9 of the front bracket. A vertically extending flange 25 (see FIG. 4) projecting from each side bracket 7 at right angles to the side wall 19 is spot welded to the vertical section 15 of the front bracket. A horizontal flange 27 extending inward along the bottom of the side wall 19 is spot welded to the lower leg 11 of the front bracket.

The rear bracket 5 of the termination frame assembly 1 is a channel member with the flanges facing upward and the web spot welded to the back end of horizontal flange 27 on the side bracket 7. The rear section of each side bracket 7 is offset outwardly from the plane of side wall 19 with the upper portion extending rearward to form a rear mounting lug 29 with a pair of apertures 32 and with the lower portion bent back inward to form a rear vertical flange 33 to which the rear flange 35 on rear bracket 5 is spot welded. The flange 33 is notched so that it does not extend inward beyond the inner face of side wall 19 above the flange on the rear bracket 5. Brackets 37 are welded to the side walls 19 to form vertically extending forward mounting lugs 39 which project outwardly approximately in alignment with the vertical section 15 of the front bracket 3. These forward mounting lugs are provided with pairs of apertures 41 at the top and bottom.

Confronting elongated slotted guides 43 in which the side edges of a printed circuit board are slidably received are bolted to the inner surface of side walls 19 of the side brackets 7. Two terminal strips 45 are horizontally mounted in openings in the vertical section 9 of front bracket 3. The terminal strips 45 have fourteen terminals 47 each on their outer face to which the field wiring, and as will be seen, grounding wires are connected. The terminal strips 45 extend through front bracket 3 and have slotted connectors 49 facing rearward which receive and make electrical contact with terminations on the edge of the printed circuit board.

A power plug 51 with rearward facing sockets which receive additional terminations on the edge of a printed circuit board is also mounted to the vertical section 9 of the front bracket 3. The electrical leads 53 connected to this plug remain on the inside of the front bracket 3 and are secured to the left side wall 19 by clamp 55 seated in an aperture 57 in the wall. The trapezoidal recess 59 in the upper edge of each side wall provides a path for the circulation of cooling air when the termination frame assemblies are stacked one above the other.

A guide block 61 with a bevelled rear edge 63 and a row of apertures 65 along the top is secured to the inner face of the vertical wall 9 of the front bracket 3 between the terminal strips 45. This guide block has two functions. The bevelled edge 63 lifts up the sagging center of the leading edge of a printed circuit board, which is inserted in the slotted guides 43, so that the terminations on the circuit board are in proper alignment for engaging the connectors 49 and power plug 51. The guide block 61 also serves as part of a keying system for preventing installation of the wrong type of circuit board in the termination frame assembly. A pin 67 is inserted in the hole 65 which is aligned with a notch in the leading edge of the type of printed circuit board designated for that termination frame assembly. If an attempt is made to insert a different member of the family of signal conditioner boards in that termination frame assembly, the pin 61 will not align with the notch in the leading edge of the board which will prevent the board from sliding forward far enough to engage the connectors 49 and power plug 51.

FIG. 6 represents one of the family of printed circuit boards 69 that can be installed in the termination frame assemblies 1. Projections 71 on the leading edge of the board carry the electrical terminations which make electrical contact with circuits inside the connectors 49 when the board is installed in the termination frame assembly 1. Another projection 73 carries terminations which complete circuits between components on the board 69 and the leads 53 connected to power plug 51 in like manner as the board is installed. Still another projection 75 between the projections 71 cooperates with the bevelled edge 63 on guide block 61 to lift the leading edge of the board 69 to assure proper alignment for mating of the projections 71 and 73 with the connectors 49 and plug 51 respectively. The notch 77 in projection 75 is positioned laterally as previously mentioned to receive the keying pin 67 when the board is installed in the proper termination frame assembly. Commercially available injector/ejector tabs 78 pivotally mounted on the trailing corners of the circuit board 69 engage leverage points 79 formed by the bends in the side brackets 7 to assist in the installation and removal of the circuit board.

Mounted on the trailing edge of circuit board 69 are connectors 80 which connect the circuits on the board with additional circuitry discussed below. A stiffener in the form of an angle member 81 is secured along the trailing edge of the circuit board 69 with a depending flange carrying captive bolts 83 which are screwed into threaded holes 85 in the upwardly extending rear flange of rear bracket 5. With the trailing edge of the circuit board 69 thus secured, the leading edge gripped by the connectors 49 and plug 51 and supported by block 61 and with the slotted guides 43 provided with multiple springs which firmly but slidably grip the side edges, the circuit board 69 is securely mounted in the termination frame assembly 1 to resist seismic vibrations.

In the preferred arrangement, a plurality of termination frame assemblies 1 each carrying a signal conditioner circuit board 69 are stacked one on top of another between a pair of confronting U-shaped vertically extending channel members 87. The front leg 89 of each channel member 87 is provided with regularly spaced threaded holes 91 which receive bolts 93 passing through the apertures 41 in the forward mounting lugs 39 on the termination frame assemblies. The rear leg 95 of each channel member terminates in a flange 97 turned inward toward the front leg 89. Another set of regularly spaced threaded holes in the flange 97 receive bolts passing through the aperture 31 in the rear mounting lugs 29 on each side of the termination frame assemblies. The vertical channel members 87 are connected at the top and bottom by horizontal channel members 88 to form a rigid composite structure. With this stacked arrangement, the horizontal section 13 and vertical section 15 on each termination assembly form, with the forward underside 11 of the termination frame assembly above, a recess or trough 99 extending across the front of each assembly. The rear wall of this trough 99 formed by section 15 of the front bracket 3 is approximately in alignment with the front face of the front legs 89 of channel members 87.

The field wiring 101, that is the wiring from the remote sensors and circuits in the data acquisition or other electrical system, are routed vertically, either from above or below, along the front faces of the front legs 89 on channel member 87 and secured in place by conventional cable ties 103 which are secured in regularly spaced holes 105 in the channel legs. The field wiring for each signal conditioner board is diverted horizontally through the trough 99 integrally formed in the associated termination frame assembly with the individual conductors and shielding connected to designated terminals 47 on the terminal strips 45. Certain terminals 47 are dedicated to grounds for the circuit boards and ground leads 107 from these terminals are routed through the troughs 99 and secured to the channel members 87 by bolts 94. Since the channel members 87 are also made of electrically conductive material, preferably steel, the connection of the ground leads 107 and the termination frame assemblies directly to the steel channels 87 provides a common ground for the assembly. In order to provide a low impedance path to the system ground for the assembly, a ground bus bar 109 extends along the channel 87 between the legs 89 and forward mounting lugs 39 on the termination frame assemblies and is secured by the bolts 93 and 94. The field wiring 101 may be routed along one channel member 87 or both, as shown. In either case, an orderly arrangement is provided which affords easy access to all of the field wiring terminations.

Figure 8:
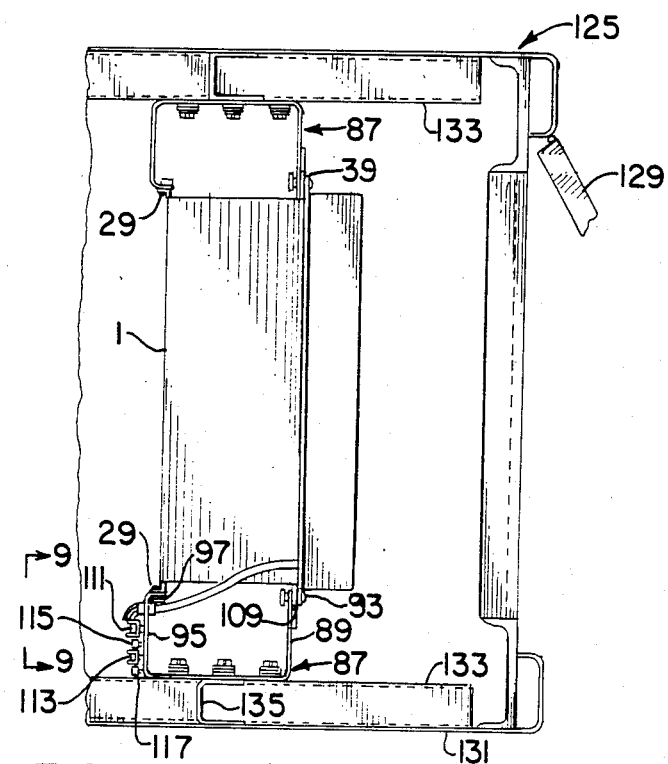
FIG. 8 is an enlarged partial horizontal section through such a cabinet taken along the lines 8—8 in FIG. 7.
Figure 9:
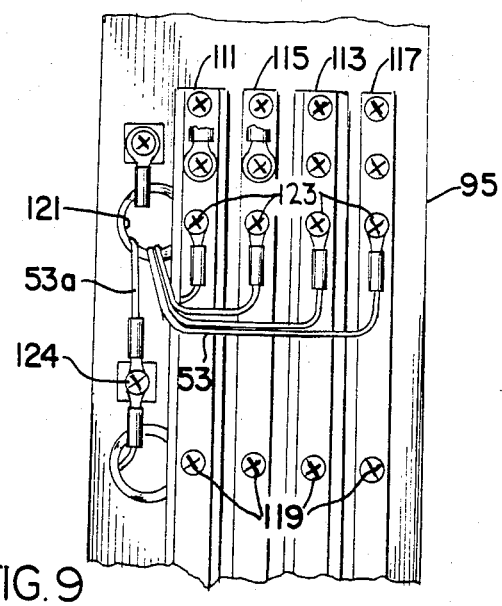
FIG. 9 is an enlarged partial elevation view taken along the lines 9—9 in FIG. 8 illustrating the bus bars running along one of the vertical channel members supporting the stacked termination frame assemblies.

The steel channel members 87 not only secure the termination frame assemblies 1 in a rigid structure, but they also provide shielding along the sides of the assemblies. In addition, they support bus bars for power supplies and test signals for the circuit boards which are readily accessible but are also shielded from EMI from the field wiring. As seen in FIGS. 8 and 9, +15 volt and analog reference signal busses 111 and 113 and +15 volt common and analog reference signal common busses 115 and 117 respectively run vertically along the rear face of rear leg 95 of left channel member 87 and are secured in place by spaced screws 119. Electrical leads 53 from the power plug 51 on the termination frame assemblies pass through a grommeted hole 121 in the rear leg 95 and are connected to the power and reference signal busses as appropriate by terminal screws 123. Two of the leads 53a from each power plug 51, which also pass through hole 121, are connected to similar leads from the termination frame assemblies above and below at insulated terminals 124 on leg 95 to form a series circuit which is completed by a jumper between a pair of terminations on each circuit board which engage the plug 51. This series circuit provides an indication to a microprocessor that all the board are installed.

Preferably, the stack of termination frame assemblies held together by the vertical and horizontal channels 87 and 88 is mounted in a cabinet 125 having front and rear doors 127 and 129 respectively. Extending horizontally and vertically along the side walls 131 of the cabinet are channels members 133 and 135 respectively to which the vertical channel members 87 are bolted with the front faces of the termination frame assemblies 1 facing, but spaced from, the cabinet rear door 129. Between the stack of termination frame assemblies and the front door 127 of the cabinet, a card cage 137 housing the microprocessor circuit boards or other signal processing boards of the data acquisition or other electrical system, is mounted on angle members 139 and 141 running vertically along the sides of the cabinet. Also mounted in this front part of the cabinet are a power supply 143 and a blower 145 for circulating cooling air through the cabinet.

The signal conditioner circuits housed in the termination frame assemblies are connected with the microprocessor boards in the card cage 137 by cables 147 connected to the connectors 80 on the trailing edges of the signal conditioner boards. Only one cable 147 is shown in FIG. 7 for clarity, but it is to be understood that similar cables are connected between all of the signal conditioner circuit boards and the microprocessor and are preferably routed along the rear face of the left channel member 87 as viewed through the front cabinet door. The power supply 143 is connected to the +15 volt power supply busses 11 and 15 running down the rear face of the right channel member 87 while the analog reference signal busses 113 and 117 receive signals from the card cage 137.

With the disclosed arrangement, the field wiring is accessible through the rear door and the signal conditioner circuit boards are accessible through the front door of the cabinet with an EMI barrier in between. This barrier is an integral part of the unique design of the stacked termination frame assemblies which provides a compact, orderly arrangement for the field wiring in which all of the field wiring terminals are presented in a plane parallel to the plane of the door opening with the wiring routed through integral recessed troughs behind the terminals. The signal conditioning circuit boards are installed and removed through the front door of the cabinet and insertion of the board into the termination frame assembly effects connection of the circuit boards to their power supplies and to the field wiring. Cabling to the microprocessor is then connected to the connectors on the trailing edges of the circuit boards. The card cage 137 housing the microprocessor, and for that matter the power supply 143, can be slidably mounted in the cabinet for easier access to the signal conditioning circuit boards directly behind them.

While specific embodiments of the present invention have been descirbed in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the appended claims and any and all equivalents thereof.

What is claimed is:

1. A termination frame assembly for supporting a generally planar electronic circuit board and for isolating said board from electromagnetic interference from a bundle of field wiring which supplies signals to said board, said assembly comprising:

a substantially rectangular frame member having a front edge and a rear edge;

an electrically conductive barrier member extending inwardly from one face of said rectangular frame member generally in a direction perpendicular thereto and substantially across said one face with at least one portion of said barrier member spaced from the front edge of said frame member;

means for mounting said electronic circuit board on said frame member on one side of said barrier member between said barrier member and the rear edge of the frame member; and terminal strip means secured to one of said frame member and said barrier member on a second side of said barrier member and having a plurality of terminals on said second side of the barrier member to which said field wiring is connected, said terminal strip extending through said barrier member and having connector means on the one side of said barrier for making electrical connection between said terminals and circuits on said electronic circuit board, said barrier member extending a sufficient distance from said one face of said frame member and having said at least one portion spaced a sufficient distance from said front edge of the frame member to form a recess in which said bundle of field wiring can be routed from one side of said assembly across said frame member on the second side of said barrier member to the terminal strip means substantially without extending beyond the front edge of the assembly or beyond said barrier member in a direction perpendicular to said one face of the rectangular frame member.

2. The assembly of claim 1 wherein said barrier member has a first portion which extends from the front edge of said frame member substantially perpendicular to said one face thereof and terminating in a remote edge, a second portion which extends from the remote edge of said first portion generally in the direction of the rear of the frame member at a spaced distance from the plane of the mounted circuit board and terminating in a rear edge, and a third portion extending from the rear edge of said second portion substantially perpendicular to said one face of the frame member, said terminal strip means being mounted on and extending through said first portion of the barrier member with the second and third portions forming said recess for the bundle of field wiring.

3. The assembly of claim 2 wherein said electronic circuit board mounting means includes confronting elongated slotted members extending along each side of the frame member in which side edges of an electronic circuit board are slidable, said circuit board being inserted into the slots of said elongated slotted member from the rear edge of frame with a leading edge of the circuit board having edge connectors extending toward the terminal strip means for engaging and making electrical contact with the connector means on said terminal strip with the board fully inserted in said slots.

4. The assembly of claim 3 including an electrical plug with electrical leads connected thereto for supplying additional electrical signals to the circuit board mounted on said one side of the first portion of the barrier member with said leads on the one side of said barrier member and having connections which mate with and make electrical contact with additional electrical connectors on the leading edge of said circuit board as the circuit board is fully inserted in the slots of the elongated slotted members.

5. The assembly of claim 4 including further connector means adjacent a trailing edge of the electronic circuit board which connect the circuits on the electronic circuit board to remote circuitry through off board electrical leads.

6. The assembly of claim 3 including bevelled guide means mounted on said frame which lift up a center portion of the leading edge of an electric circuit board as the edge connectors thereon approach the connector means on the terminal strip to assure mating of the edge connectors and connector means with the electronic circuit board fully inserted.

7. The assembly of claim 6 adapted for use with several types of electronic circuit boards each of which is provided with keying means located along its leading edge at a selected point and wherein complimentary keying means selectively positionable transversely to the direction of insertion of the circuit board into the frame assembly are provided on the assembly with the circuit board being fully insertable in the frame assembly only when said complimentary keying means is positioned to register with the keying means on the type of board being inserted.

8. The assembly of claim 7 wherein the said selectively positionable complimentary keying means comprises a series of holes in said guide means and a pin selectively insertable in one of said holes and wherein said keying means on said electronic circuit board comprises a notch in the leading edge of said board which receives said pin and permits the board to be inserted fully when said pin is positioned in the hole aligned with said notch.

9. The assembly of claim 3 including brackets extending laterally from each side of the frame member substantially in alignment with the third portion of the barrier member for securing said assembly to vertical support members.

10. The assembly of claim 9 including additional brackets extending from each side of the frame member in the vicinity of the rear edge thereof also for securing said assembly to vertical supports.

11. The assembly of claim 10 including means for firmly securing the trailing edge of said electronic circuit board to the frame member adjacent the rear edge thereof and wherein the slots in the elongated slotted members are provided with means which slidable but firmly grip the side edges of the electronic circuit board and wherein the connectors on the leading edge of the electronic circuit board are rigidly connected to said leading edge and are firmly gripped by the connector means on said terminal strip means such that said electronic circuit board is firmly secured along all its edges to resist seismic disturbances.

12. Apparatus for mounting a plurality of signal conditioner circuit boards and for isolating them from electromagnetic interference from the field wiring which provides electrical signals to them, comprising:
a pair of horizontally spaced vertically extending elongated supports;
a plurality of termination frame assemblies each comprising:
a substantially rectangular frame member having a front and a rear;
an electrically conductive barrier member having a first portion extending substantially vertically upward along the front of the rectangular frame member, a second portion extending rearward, substantially horizontally from the top of said first portion and terminating in a rear edge, and a third portion extending substantially vertically upward from the rear edge of said second portion;
means for installing a signal conditioner circuit board on said substantially rectangular frame member between the first portion of said barrier member and the rear of said frame member from the rear of said frame member with a leading edge of the signal conditioner circuit board substantially parallel to the front of the frame member;
terminal strip means mounted to and extending through said first portion of the barrier member and having field terminals on a first side of said first portion of the barrier member facing the front of the frame member to which the field wiring is connected and having connector means on a second side of the first portion of the barrier member facing the rear of the frame member to which circuits on said signal conditioning circuit board are connected; and
means on each side of each termination frame assembly for securing the same between said vertically extending elongated supports in substantial vertical alignment one on top of another and with the second and third portions of each barrier member and the frame assembly above forming a substantially horizontal trough accessible from the front extending across each termination frame assembly; and
means for securing bundles of the field wiring along the elongated vertical supports with the field wiring for each signal conditioner circuit board being routed horizontally through said trough formed in the front of the associated termination frame assembly to the terminals on the front thereof.

13. The apparatus of claim 12 wherein each termination frame assembly inludes electrically conductive side walls extending substantially vertically between the frame member and the second portion of the barrier member from the first portion of the barrier member rearward at least to the third portion of the barrier member and an electrically conductive bottom wall extending from the front edge at least as far rearward as the third portion of the barrier member, wherein said means for securing each said termination frame assembly to said vertically extending elongated supports comprise means which approximately align a front surface surface of the third portion of said barrier member with a front face of said supports and wherein said bundle securing means secure said bundles of field wiring along the front faces of said supports such that said bundles of wires are routed vertically along said supports and horizontally through the appropriate trough substantially in a common vertical plane.

14. The apparatus of claim 13 wherein said vertically extending elongated supports are constructed at least in part of electrically conductive material, said apparatus including at least one electrical conductor extending vertically along at least one of said vertical supports and separated from the bundles of field wiring routed along the front face thereof by said electrically conductive material, electrical terminals along the electrical conductor adjacent at least some of said termination frame assemblies and electrical leads connecting selected terminals with the adjacent termination frame assembly.

15. The apparatus of claim 14 wherein said termination frame assembly includes a plug to which said electrical lead is connected and which engages a termination on the leading edge of the signal conditioner circuit board to electrically connect a circuit on the circuit board through said electrical lead to said electrical conductor as said circuit board is installed in said frame members from the rear thereof.

16. The apparatus of claim 15 including additional electrical leads serially connecting said plugs on selected termination frame assemblies and wherein said signal conditioner circuit boards on said selected termination frame assemblies include on their leading edge a pair of electrically connected terminations which when said board is installed in the termination frame assembly engage said plug to complete an electrical circuit between the additional leads connected to said plug such that only with the signal conditioner circuit boards installed on all of the selected terminal frames will the serial electrical circuit through all of said additional electrical leads be completed.

17. The apparatus of claim 13 wherein said pair of elongated supports comprise confronting U-shaped channel members with a front leg of each U defining said front face of the elongated support, and wherein said securing means comprises means for securing said terminal frame assemblies to both the front and rear legs of each U-shaped channel member.

18. The apparatus of claim 17 wherein said U-shaped channel members are made of electrically conductive material, the combination including a plurality of bus bars extending vertically along the rear leg of at least one of said channel member but electrically insulated therefrom, terminals connected to each said bus bar adjacent selected terminal frame assemblies and electrical leads connecting selected bus bars to the adjacent termination frame assembly.

19. The apparatus of claim 18 including plugs on said selected terminal frame assemblies between said barrier member and said rear of the frame assembly to which said electrical leads are connected and which are engaged by terminations on said signal conditioner circuit board as said board is installed in the frame member from the rear thereof and wherein said bus bars and terminals are mounted on the rear face of the rear leg of the U-shaped channel member with said rear leg defining apertures through which said electrical leads are routed from said terminals to said plugs.

20. The apparatus of claim 18 including a ground bus bar extending vertically along and in electrical contact with the front face of the front leg of at least one of said U-shaped channel members, ground terminals connected to said ground bus bar adjacent said termination frames, ground leads connected between a selected field terminal on the terminal strip of each terminal frame assembly and an adjacent ground terminal and routed through the associated trough to provide a ground for the associated signal conditioner circuit board and wherein said frame members and means for securing the frame members to the two legs of each channel member are made of electrically conductive material to ground the termination frame assemblies to the channel members and thus the ground bus bar such that a common ground is provided for all of the signal conditioner circuit boards, termination frame assemblies and both channel members.

21. The apparatus of claim 17 wherein said securing means comprises a mounting lug adjacent a rear edge of each side of each termination frame assembly extending parallel to the side thereof and a planar bracket extending laterally from each side of each termination frame assembly adjacent the third portion of the barrier member and wherein the rear leg of each U-shaped channel member is turned forward toward the front leg to form a mounting flange, said termination frame assemblies being inserted between said U-shaped channel members from the front with said lugs secured to the mounting flanges on the rear legs and the brackets being secured to the front faces of the front legs.

22. The apparatus of claim 21 in combination with a cabinet having a front door and a rear door, means for mounting said apparatus in said cabinet with the front of the termination frame assemblies and the field wiring facing and accessible through the cabinet rear door, a card cage containing a plurality of signal processing circuit cards mounted in said cabinet between the rear edge of the termination frame assemblies and the cabinet front door, and electrical cabling connected between terminations on the rear edge of said signal conditioner circuit boards and the conditioned signal processing circuit cards for applying conditioned signals from the signal conditioner circuit boards to the signal processing circuit boards, said card cage being mounted for removal from the space between the rear of the termination frame assemblies and the cabinet frame door to provide access through the cabinet front door to said signal conditioner circuit boards.

23. The combination of claim 22 including power supply bus bars extending vertically along the rear face of the rear leg of at least one of said U-shaped channel members, and accessible through the cabinet front door, a plug mounted on each termination frame assembly between the barrier member and the rear of the frame assembly which is engaged by terminations on the leading edge on said signal conditioner board as the board is installed in the termination frame assembly from the rear thereof through the cabinet front door, and electrical leads connecting said plug, and therefore circuits on the signal conditioner board, with said power supply busses adjacent to said termination frame assembly.

* * * * *